United States Patent [19]
Zhou et al.

[11] Patent Number: 5,847,650
[45] Date of Patent: Dec. 8, 1998

[54] THEFT RESISTANT CIRCUIT ASSEMBLY

[75] Inventors: Peter Y. Zhou, Smithtown; Thomas A. Nicolette, Centerport; Edward J. Callaghan, Oyster Bay, all of N.Y.; Paul F. McNamara, Cary, N.C.

[73] Assignee: Knogo North America Inc., Hauppauge, N.Y.

[21] Appl. No.: 725,699

[22] Filed: Oct. 4, 1996

Related U.S. Application Data

[60] Provisional application Nos. 60/007,707 Nov. 29, 1995, 60/019,217 Jun. 6, 1996 and 60/020,797 Jun. 24, 1996.

[51] Int. Cl.$^6$ .................................................. G08B 13/14
[52] U.S. Cl. ......................... 340/572; 340/551; 340/568; 340/693
[58] Field of Search ..................... 340/551, 572, 340/568, 825.54, 825.34, 693; 428/901, 916

[56] References Cited

U.S. PATENT DOCUMENTS

| | | | |
|---|---|---|---|
| 3,496,413 | 2/1970 | Goodridge et al. | 361/226 |
| 3,498,540 | 3/1970 | Adams | 239/698 |
| 3,575,344 | 4/1971 | Angelico | 239/697 |
| 3,607,998 | 9/1971 | Goodridge | 264/439 |
| 3,698,847 | 10/1972 | Goodridge | 425/174.8 R |
| 3,828,729 | 8/1974 | Goodridge | 118/634 |
| 3,836,842 | 9/1974 | Zimmermann et al. | 324/239 |
| 3,848,243 | 11/1974 | Schirmer | 340/572 |
| 3,865,610 | 2/1975 | Goodridge et al. | 427/461 |
| 3,881,763 | 5/1975 | Benson | 294/116 |
| 3,889,015 | 6/1975 | English | 427/461 |
| 3,901,185 | 8/1975 | Goodridge et al. | 118/630 |
| 3,914,461 | 10/1975 | Goodridge | 427/461 |
| 3,916,826 | 11/1975 | Knudsen | 118/629 |
| 3,921,574 | 11/1975 | English | 118/106 |
| 3,937,179 | 2/1976 | Goodridge | 118/301 |
| 3,951,099 | 4/1976 | Minckler | 118/694 |
| 4,000,107 | 12/1976 | Galland et al. | 524/296 |
| 4,030,446 | 6/1977 | Karr | 399/290 |
| 4,053,661 | 10/1977 | Goodridge | 427/185 |
| 4,084,018 | 4/1978 | Karr | 427/460 |
| 4,101,687 | 7/1978 | Knudsen | 427/460 |
| 4,120,070 | 10/1978 | Severin | 15/309.2 |
| 4,123,175 | 10/1978 | Carlson | 366/152.6 |
| 4,297,386 | 10/1981 | Gillette | 427/459 |
| 4,325,982 | 4/1982 | Gillette | 427/461 |
| 4,330,567 | 5/1982 | Gillette | 427/460 |
| 4,332,835 | 6/1982 | Knudsen | 427/460 |
| 4,368,214 | 1/1983 | Gillette | 156/51 |
| 4,418,642 | 12/1983 | Gillette et al. | 118/624 |
| 4,568,921 | 2/1986 | Pokalsky | 340/572 |
| 4,598,921 | 7/1986 | Pokalsky | 340/572 |
| 4,623,877 | 11/1986 | Buckens | 340/572 |
| 4,665,387 | 5/1987 | Cooper et al. | 340/572 |
| 4,827,395 | 5/1989 | Anders et al. | 364/138 |
| 4,956,636 | 9/1990 | Sansom et al. | 340/551 |

(List continued on next page.)

FOREIGN PATENT DOCUMENTS

| | | |
|---|---|---|
| 0428262A3 | 5/1991 | European Pat. Off. . |
| WO9007784 | 7/1990 | WIPO . |

OTHER PUBLICATIONS

Permabond PLUS® 790 Series (1 pg), Permabond® International, Englewood, New Jersey.
Permabond® Activators and Primers (1pg), Permabond® International, Englewood, New Jersey.
Permabond PLUS® Black Magic 737 (1 pg), Permabond® International, Englewood, New Jersey.
Electrostatic Wire Coating (4 pgs), Electrostatic Technology, Inc., Branford, Connecticut.
Scotchcast® Brand Wire Coating Resin 5256 (4 pgs), Electrical/Electronic OEM, 3M Electrical Specialties Division, Austin, Texas 78769–2963.

*Primary Examiner*—Jeffery A. Hofsass
*Assistant Examiner*—Benjamin C. Lee
*Attorney, Agent, or Firm*—Fitzpatrick, Cella, Harper & Scinto

[57] ABSTRACT

Printed circuit boards and integrated circuit assemblies have security markers formed thereon by deposition techniques or affixed thereto, either directly or by prior encasement of the markers in a resin prior to such affixation.

48 Claims, 5 Drawing Sheets

U.S. PATENT DOCUMENTS

| | | | |
|---|---|---|---|
| 4,967,184 | 10/1990 | Regelsberger | 340/572 |
| 5,029,291 | 7/1991 | Zhou et al. | 340/551 |
| 5,081,445 | 1/1992 | Gill et al. | 340/572 |
| 5,081,446 | 1/1992 | Gill et al. | 340/572 |
| 5,146,204 | 9/1992 | Zhou et al. | 340/551 |
| 5,264,829 | 11/1993 | Paul et al. | 340/572 |
| 5,401,584 | 3/1995 | Minasy et al. | 428/611 |
| 5,406,264 | 4/1995 | Plonsky et al. | 340/572 |
| 5,440,295 | 8/1995 | Ciecwisz et al. | 340/573 |
| 5,481,437 | 1/1996 | Neumann | 361/796 |
| 5,499,015 | 3/1996 | Winkler et al. | 340/551 |
| 5,554,974 | 9/1996 | Brady et al. | 340/572 |
| 5,635,917 | 6/1997 | Todman | 340/825.37 |

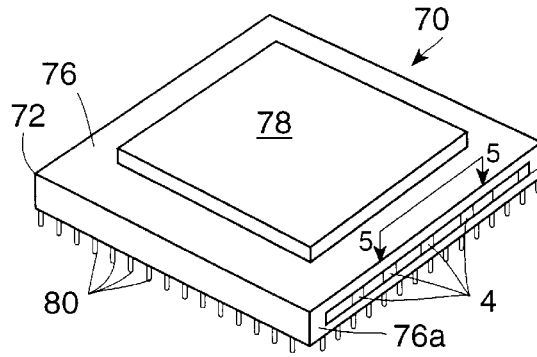
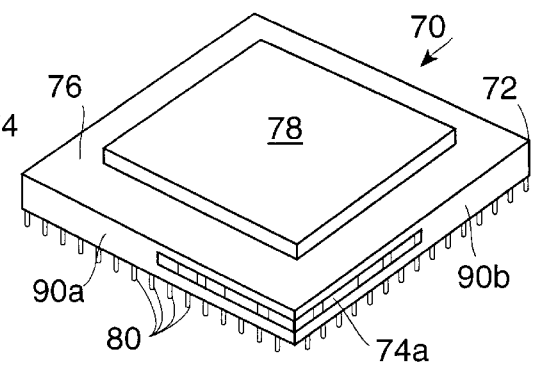
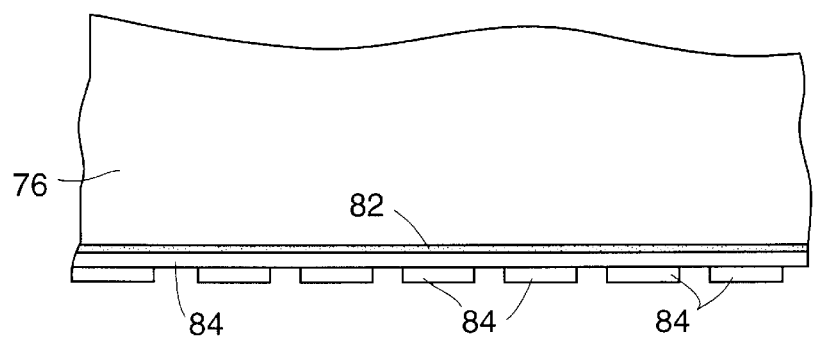
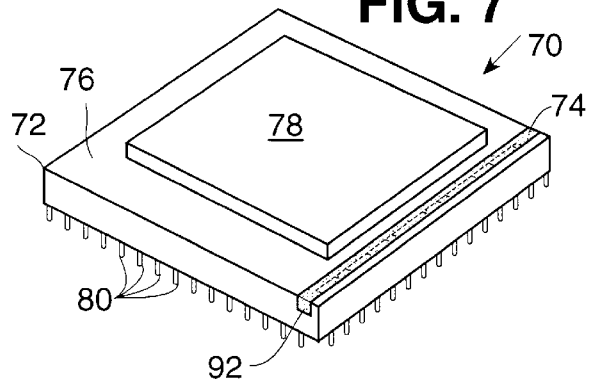
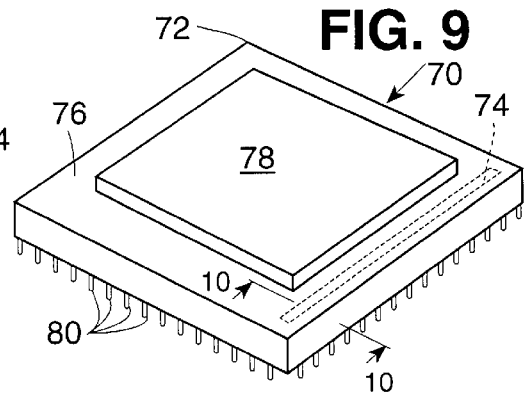
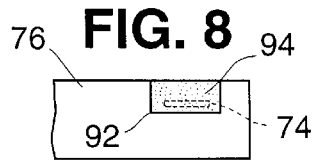

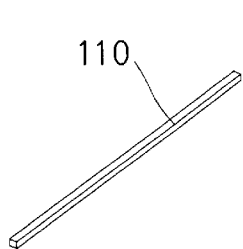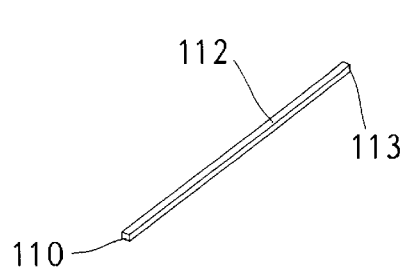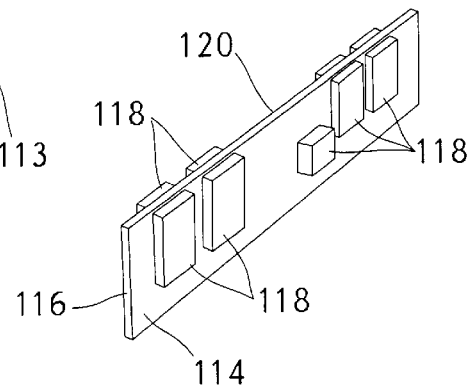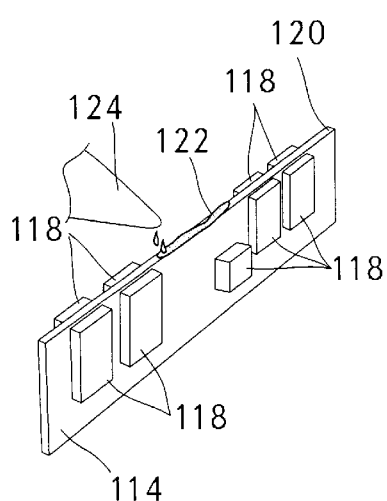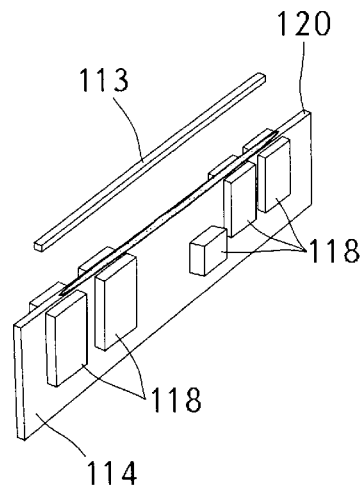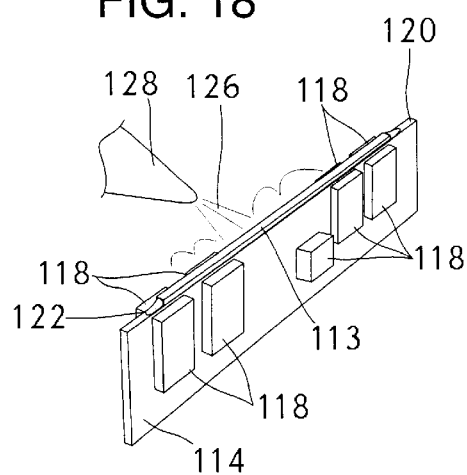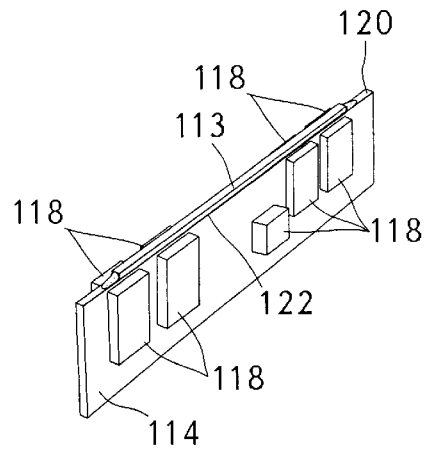

THEFT RESISTANT CIRCUIT ASSEMBLY

CROSS REFERENCE TO RELATED APPLICATIONS

This application relates to provisional applications No. 60/007,707 filed Nov. 29, 1995, No. 60/019,217 filed Jun. 6, 1996 and No. 60/020,797 filed Jun. 24, 1996.

BACKGROUND OF THE INVENTION

1. Field of the Invention

This invention relates to the protection of electrical circuit assemblies from theft; and more particularly it concerns novel electrical circuit assemblies which respond to the interrogation fields of an electronic article surveillance system.

2. Description of the Related Art

Electrical circuit assemblies, such as integrated circuits and printed circuits, which may have integrated circuits mounted thereon, are usually incorporated into larger assemblies or finished products, such as computers, calculators, radios, telephones, etc. It is known to protect these finished products from theft by integrating into or mounting on the packages in which they are sold, special markers which consist of a readily magnetically saturable material of low magnetic coercivity. When the product is taken through an interrogation zone, usually the exit from a store, it passes through an alternating magnetic field in the interrogation zone. The special marker reacts with the alternating magnetic field and produces characteristic electromagnetic disturbances of the field. These characteristic electromagnetic disturbances are detected and used to actuate an alarm.

While it is important to protect finished products from theft, it has been found that the subassemblies of these products, such as integrated circuits and printed circuits, are also subject to theft, often from employees involved in the manufacturing operation.

U.S. Pat. No. 4,568,921 and No. 5,146,204 describe electronic article surveillance systems for protecting articles from theft or unauthorized removal from protected areas. These systems comprise interrogator apparatus which produce electromagnetic interrogation waves at exits from a protected area. Security markers are attached to articles in the protected area; and when an article is brought through an exit, it reacts with and disturbs the interrogation waves in a distinctive manner. These distinctive disturbances are detected and a signal is produced to indicate the taking of the article through the exit.

In some of these examples, a security marker is mounted on a strip of paper or plastic and then covered by another strip of paper or plastic to form a laminate or package which contains the marker. This package is then glued or otherwise adhered to an article to be protected. In other examples, the security marker is formed directly on the article to be protected by means of a deposition technique such as electroplating, electrodeposition, sputtering, vacuum deposition, etc.

U.S. Pat. No. 4,623,877 describes in detail an electronic article surveillance system which uses magnetically saturable security elements (also known as "markers" or "targets") on articles to be protected from theft. When these articles pass through a doorway or other exit point, they become exposed to alternating magnetic interrogation fields which are generated by an electronic article surveillance system antenna near the doorway or exit point. These fields drive the security elements on the articles into and out of magnetic saturation; and this in turn produces characteristic disturbances of the interrogation field. A receiver antenna, which is set up at the exit point, is connected to a signal processor which selects from the received signals those that correspond to the characteristic disturbances. These selected signals are then used to generate an alarm.

U.S. Pat. No. 4,967,184 relates to the application of a ring-shaped ferromagnetic surveillance marker between the hub flange and the substrate of a magnetic computer disc. The magnetic permeability and coercivity of the disc hub are chosen to allow the marker and the disc to operate without mutual interference.

U.S. Pat. No. 5,081,445 relates to the attachment of electrical article surveillance (EAS) tags to merchandise at the location where the merchandise is manufactured. The tags are applied to the merchandise in a deactivated condition; and then they are reactivated when the merchandise arrives at the store where it is to be sold.

U.S. Pat. No. 5,499,015 relates to the mounting of electronic article surveillance (EAS) markers in a cavity provided in an item to be protected. For example, the cavity may be formed in the housing of a consumer appliance.

U.S. Pat. No. 5,081,446 relates to a resonant security tag on a container for a compact disc. This tag is so positioned that its resonant frequency is established in part by reaction with the compact disc.

U.S. Pat. No. 5,406,264 illustrates how an electronic article detection system can be applied to articles other than merchandise which is to be sold. This patent describes a gaming chip in which a magnetically responsive element, referred to an a "marker", is incorporated so as to protect the gaming chip from theft.

U.S. Pat. No. 4,665,387 shows the use of markers of this general type to protect various articles of merchandise such as books in a library and video and audio cassettes. In addition, U.S. Pat. No. 5,440,295 shows the use of an electronic transponder to protect against theft of new-born infants from hospitals.

U.S. Pat. No. 4,956,636 and European patent application EP 0 428 262 describe the depositing of magnetic material on a polyester substrate by electroplating to form a security tag that can be attached to an article to be protected.

International Application WO 90/07784 describes the forming, by electrodeposition, electroforming or electroless deposition, on a mould, die, template, tool or mandrel, of a magnetic foil which is then removed and made into a security marker.

U.S. Pat. No. 5,401,584 describes a process of electroplating magnetic deactivation elements onto a security marker.

One problem that is likely to be encountered when a security element is attached to an electrical circuit subassembly is that during its operation, or during various stages of its production or assembly with other components, the subassembly becomes subjected to high temperatures. For example, many integrated circuit assemblies, particularly those which perform microprocessing operations, require a heat dissipation element, such as a copper plate, to prevent overheating during their operation. Also, during the manufacture of these integrated circuit assemblies they are subjected to soldering operations in which they are positioned over a bath of molten solder which adheres to connector pins on the assembly and affixes them to other components. These high temperatures can weaken the adhesives that may be used to attach a security strip to the integrated circuit assembly. In addition, problems may arise even when the adhesive does not weaken at high temperatures. This would occur, for example, where the hardened adhesive does not have the same coefficient of thermal expansion as the security strip or the surface to which it is adhered. As a result, the bond between the adhesive and the strip, or between the adhesive and the integrated circuit assembly, would be weakened.

For certain applications, for example where a security marker is to be attached along the edge of an electronic printed circuit board, it is difficult to provide secure adhesion between the marker and the article to which it is to be attached, particularly where the article is subject to flexing. This is because the available adhesives often fail to adhere adequately to both the marker and the article.

The miniaturization of electrical circuits has made it possible to utilize electronics in ways that were heretofore impossible. Highly advanced microprocessors or "microchips" now can be made to perform large numbers of functions; and this in turn has led to significant advances in the control and processing of information.

However, this same miniaturization has led to certain problems. First, because many different capabilities can now be incorporated into a very small integrated circuit, the circuit itself becomes very valuable and subject to theft. Secondly, the current state of electronic article theft technology requires the use of detection "markers" which are too large to be effectively mounted on some integrated circuits.

SUMMARY OF THE INVENTION

The present invention provides a different approach to the protection of articles by means of security markers. According to the present invention, subassemblies, such as integrated circuits and printed circuit boards, are protected by means of security markers mounted on the subassemblies themselves. The security markers serve not only to protect the subassembly from theft, but they may also be used to protect the overall finished product into which the subassembly is incorporated, provided of course, that the amount and type of metal in the finished product is not such as to shield or inhibit the effective operation of the marker. This not only protects the subassembly from theft in the factory or manufacturing or assembly plant, but it also protects the finished product from theft at the point of distribution or sale.

It has been found that the presence of a security marker of easily saturable, low magnetic coercivity material does not affect the normal operation of the electrical circuits adjacent which the security marker is mounted; nor does the presence of those electrical circuits affect the operation of the security markers themselves.

According to a first aspect of the invention there is provided a theft resistant circuit subassembly, which comprises at least one conductive electrical circuit, and a security element in the form of a magnetizable material which becomes driven into and out of magnetic saturation in response to an alternating magnetic field. The security element is mounted to extend along and adjacent to the conductive electrical circuit.

The invention, in more specific aspects, involves novel techniques for mounting security markers on electrical circuit subassemblies.

According to a second aspect of the present invention there is provided a printed circuit board assembly which comprises a sheet of electrically non-conductive material and an electrically conductive layer laminated on a surface of the sheet. The conductive layer is shaped to provide a portion of an electrical circuit. A security element, which comprises a film of low magnetic coercivity material which is easily magnetically saturated, is formed on the electrically conductive layer.

In one advantageous embodiment according to this second aspect of the invention, the electrically conductive layer on which the security element is formed is an expansive, continuous layer which serves as an electrical ground plane on one side of the sheet and which is connected, via plated through holes, to electrically conductive signal pathways on the other side of the sheet.

According to a more specific feature of this invention, a laminate of at least two electrically non-conductive sheets, with the electrically conductive layer and the security element being sandwiched between the sheets.

The present invention, in this aspect, also recognizes that electronic article surveillance techniques can be used, not only to protect articles in their end use condition, but, under certain conditions, such techniques can also be used to protect components that are to be incorporated into larger assemblies. The present invention is particularly suited to the protection of integrated circuit assemblies which are to be mounted onto circuit boards. These circuit boards are then assembled into larger units such as computers and computer terminals.

According to a third aspect of the present invention, a security member is formed directly onto the surface of a metal plate which is attached to, and forms the heat dissipating element of, an integrated circuit assembly. The security member may be formed as a film directly on the metal plate by a process of electroplating. The security member may also be formed as a film by electroless plating, by vacuum coating, chemical vapor deposition, and/or a thermal spray process.

This third aspect of the present invention also involves a novel method of manufacturing an integrated circuit assembly. According to this method, a security member is formed as a film directly onto a metal plate by a process of electroplating, electroless plating, vacuum coating, chemical vapor deposition, and/or a thermal spray process. The metal plate is mounted onto an integrated circuit to form a heat sink.

According to a fourth aspect of the present invention there is provided a novel theft resistant integrated circuit assembly which comprises at least one integrated circuit supported by a rigid element and a security element in the form of an elongated strip of magnetizable material which becomes driven into and out of magnetic saturation in response to an alternating magnetic field. The security element with its deactivation elements is mounted to extend along the rigid non-metallic element adjacent the integrated electrical circuit. This theft resistant integrated circuit assembly may be protected from theft or other unauthorized removal by means of an electronic article surveillance system without adverse effects on the operation of its own electronic components.

In one advantageous embodiment according to this fourth aspect, the security element has associated therewith a plurality of magnetizable deactivation elements which, when magnetized, effectively deactivate the security element. The activation and deactivation of the security element by demagnetization and magnetization of the deactivatable elements also does not adversely affect the operation of the integrated circuit assembly. Further, this integrated circuit assembly, and the larger assemblies into which it is subsequently incorporated, can be switched from a protected to an unprotected condition, and vice-versa, so that they can be transferred to successive stages of manufacture and distribution and then switched back to a protected condition at each stage.

The present invention in this fourth aspect also involves a novel method of protecting an electronic assembly during successive stages of manufacture and distribution. This fourth aspect involves the steps of providing an integrated circuit assembly which comprises at least one integrated electrical circuit supported by a rigid non-metallic support element and which further comprises a security element in the form of an elongated strip of magnetizable material which becomes driven into and out of magnetic saturation in response to an alternating magnetic field. The security element is mounted to extend along the support element adjacent the integrated electrical circuit. Thereafter the integrated circuit assembly is incorporated into a larger assembly, with the security element remaining mounted on the integrated circuit assembly, whereby the security element automatically protects the larger assembly, provided of course, that the amount and type of metal in the larger assembly is not such as to shield or inhibit the effective operation of the marker.

In an advantageous embodiment, the security element has associated therewith a plurality of magnetizable deactivation elements which, when magnetized, effectively deactivate the security element. The magnetized state of the deactivation elements is changed prior to incorporating said integrated circuit assembly into a larger assembly. Consequently the successive assemblies can be put into an unprotected state for transfer to a succeeding stage of manufacture or distribution; and thereafter they may be returned to a protected state for security while at the location of such subsequent stage of manufacture or distribution.

The invention in a fifth aspect, also provides a novel method of attaching security marker to articles to be protected. This novel method comprises the steps of coating a security marker with a fluid material which is capable of becoming solid, then solidifying the material to form an enclosure which encases the security maker; and thereafter adhering the enclosure to the surface of an object.

According to this fifth aspect, there is also provided a novel theft resistant assembly which comprises an article, a security marker, a moldable casing which encloses the security marker, and an adhesive which holds the casing to the article.

BRIEF DESCRIPTION OF THE DRAWINGS

FIG. 4 is a perspective of an integrated circuit assembly comprising another embodiment of the present invention;

FIG. 5 is an enlarged fragmentary section view taken along line 5—5 of FIG. 4;

FIG. 6 is a view similar to FIG. 4 but showing a modified form of the integrated circuit assembly;

FIG. 7 is a perspective of an integrated circuit assembly comprising a further embodiment of the present invention;

FIG. 8 is an enlarged fragmentary section view taken along line 8—8 of FIG. 7;

FIG. 9 is a perspective of an integrated circuit assembly comprising a still further embodiment of the present invention;

FIG. 10 is an enlarged fragmentary section view taken along line 10—10 of FIG. 9;

FIG. 13 is a perspective view of a security marker to be attached to a printed circuit board according to the present invention;

FIG. 14 is an enlarged cross sectional view of the security marker of FIG. 13 as encased in a coating material according to the present invention;

FIG. 15 is a fragmentary perspective view of a printed circuit board to which the security marker of FIG. 13 is to be attached;

FIG. 16 is a view similar to FIG. 15 showing the application of an adhesive to an edge of the printed circuit board;

FIG. 17 is a perspective view showing the assembly of the encased security marker of FIG. 14 to the edge of the printed circuit board of FIG. 3;

FIG. 18 is a perspective view showing the activation of an adhesive on the edge of the printed circuit board of FIG. 16; and FIG. 19 is a perspective view of a finished printed circuit board and security marker assembly according to the present invention.

DETAILED DESCRIPTION OF THE PREFERRED EMBODIMENTS

Figure 1:
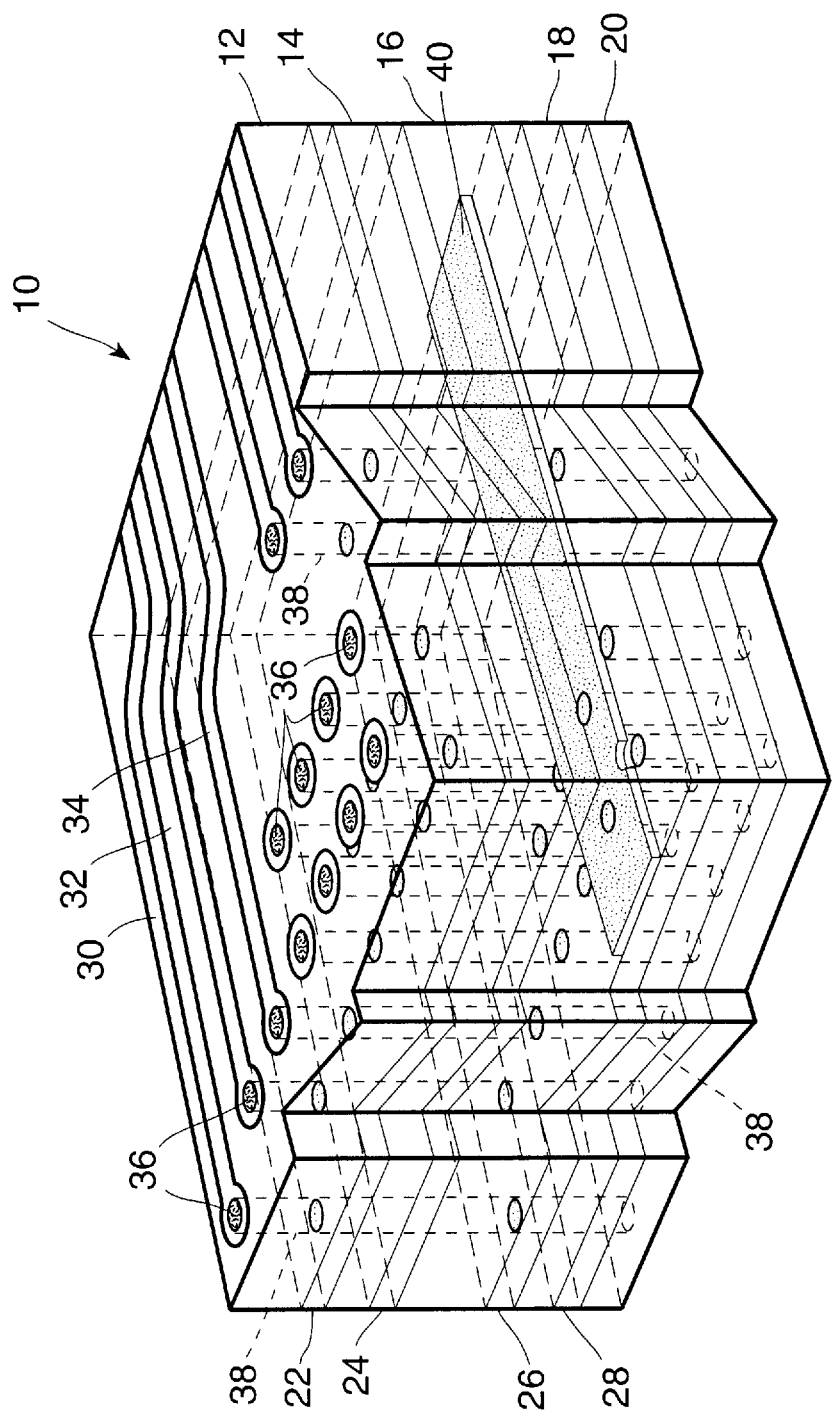
FIG. 1 is a fragmentary perspective view of a portion of a printed circuit board according a preferred embodiment of the present invention.

In the fragmentary perspective view of FIG. 1, a printed circuit board 10 is shown exaggerated in thickness in order better to visualize and explain the invention. The printed circuit board 10 is a laminate of epoxy resin sheets 12, 14, 16, 18 and 20 and copper foil layers 22, 24, 26 and 28 interposed between the epoxy resin sheets. The composition of the epoxy resin sheets is not critical to this invention; and any composition generally used in the printed circuit industry may be used in connection with the invention. Also, the thickness of the epoxy resin sheets is not critical to the invention.

The copper foil layers 22, 24 26 and 28 may be laminated on the surface of the epoxy resin sheets in any known manner, for example by electroplating, before the sheets are laminated together. The copper foil layers may be of minimal thickness, for example 50 microns, inasmuch as they need only conduct very small electrical currents.

After the copper foil layers have been laminated onto the epoxy resin sheets, at least some of them are subjected to etching to form electrical pathways. Examples of such pathways are shown at 30, 32 and 34 on the outer surface of the upper epoxy resin layer 12. Depending on the complexity of the circuits to be formed, several of the copper foil layers may be etched so as to form conductive pathways of appropriate configuration.

At selected locations, depending on the particular circuit to be formed, terminals 36 on the conductive pathways of one copper foil layer are electrically connected to corresponding terminals on the pathways of another copper foil layer. This is done by providing holes 38 through the intermediate epoxy resin layer or layers and plating the inner surfaces of these holes. Some of the holes 38 also accommodate wire connectors (not shown) of integrated circuits which are to be mounted on the printed circuit board.

At least one of the copper foil layers, namely the layer 26, is not etched to form conductive pathways. Instead, this layer extends substantially continuously between the adjacent epoxy layers. The purpose of this last mentioned layer is to form a ground plane to which selected terminals 36 may be connected via plated through holes 38.

Where it is desired to have a connection between conductive pathways which are not to be grounded, the ground plane layer 26 is etched away in the region of the respective plated through hole. In any event the ground plane layer 26 remains essentially continuous and is characterized by an expansive surface.

As can be seen in FIG. 1, there is provided a security element 40 which is formed on the ground plane layer 26. The security element is in the form of a film of a low magnetic coercivity material which has been deposited on the ground plane layer 26. The security element 40 may be formed prior to attachment to the layer 40 and then secured by adhesive; but it is preferred to form the security element 40 by a deposition process such as electroplating. The security element 40 may also be deposited on the ground plane layer 26 by electroless plating, vacuum coating, chemical vapor deposition and/or a thermal spray process.

When forming the security element 40 by electroplating, the material of the element can be made to have a crystalline or an amorphous form. This is achieved by controlling temperature, pressure, current, etc. of the electroplating process. It is important that the security element 40 have good magnetic properties. That is, the security element should have a magnetic coercivity in the range of 0.1 and 1.0 oersteds, and preferably about 0.25 oersteds. It should have a magnetic permeability in the range of 100,000 and 1,000,000, and preferably about 750,000. Also, the security element 40 should have a magnetic saturation in the range of 0.5 and 2.0 Telsa and preferably about 0.6 Telsa. The composition of the security element is preferably about 80% cobalt and 20% phosphorous.

Alloys of cobalt and nickel as well as Permalloy® may also be used.

A preferred method of depositing the material of the security element 40 onto the ground plane layer 26 is that of electrodeposition or electroplating. In this method an amorphous cobalt phosphorous alloy film is deposited directly onto the copper ground plane layer 26. The film has high magnetic permeability and low magnetic coercivity. The film is deposited by an electrodeposition process in a manner well known to those skilled in the art. The electrodeposition or plating takes place in a bath which consists of an aqueous acidic solution of cobalt carbonate and phosphorous acid.

Preferred operating parameters of this process are as follows:
Bath temperature: 84°–86° Centigrade
Bath acidity: 0.5–1.0 pH
Plating current: Sinusoidal alternating current with a frequency of 5 Hertz, varying between +0.6 and −0.2 amperes per square centimeter ($A/cm^2$).
Plating anode: Cobalt The deposition process is carried out until the deposited film attains a thickness in the range of 0.5 to 15 microns, and preferably about 10 microns.

Because the ground plane layer 26 has an expansive surface it readily accommodates the security element 40; and the copper material of the ground plane is ideal for the forming of the security element by electroplating. Care should be taken to position the security element 40 such that it does not contact any plated through hole which is not connected to the ground plane. By using an electroplating process on the copper foil layer 26 after it has been etched away to accommodate the plated through holes which are not to be grounded, the electroformed security element 40, which is formed only on the copper surface, will not interfere with those plated through holes.

The effectiveness of a security element as a marker for an anti-theft detection system depends on a high ratio of length to cross-sectional area. Thus, both for purposes of minimal effect on laminating characteristics and maximum effect on electromagnetic signals to be detected, the thickness of the security element film should be minimal. As mentioned, the thickness should be in the range of 0.5 to 15 microns; and preferably, it should be about 10 microns.

It has been found that the detectability of the film which constitutes the security element 40 may be significantly increased by subjecting it to a heat treating process in which the temperature of the strip is increased for a time. Preferably, the security element film should be heated to and maintained at a temperature of at least 100 degrees Centigrade for a duration of at least one hour; or heated to and maintained at a temperature of at least 200 degrees Centigrade for a duration of at least five minutes. This heat treatment serves both to increase the magnetic permeability and to decrease the magnetic coercivity of the security element material.

Further improvements in the detectability of the security element 40 is achieved by carrying out the heating of the security element film in the presence of an externally applied d.c. (direct current) magnetic field which is directed along the film, that is in the direction in which the film extends. The strength of the magnetic field is preferably about 120 oersteds; and it should be in the range of 70–170 oersteds.

Where the security element 40 is formed by electroplating it may be carried out by a selective plating process known as "brush plating". This involves the use of a pen-like tool which carries in it a plating solution reservoir. The tool has a positively charged electrode which is electrically connected to the copper portion of the printed circuit board layer on which the security element 40 is to be formed; whereby the positively charged electrode serves as an anode. A nib on the front of the tool is negatively charged and serves as an electroplating cathode. Electroplating fluid flows out from the reservoir and through the nib and onto the surface to be plated. Electrical current flowing through the fluid causes the metal ions in the electroplating fluid to become deposited onto the copper surface, whereby a security strip is formed on the surface by electrodeposition.

This brush plating technique, which is well known per se, provides particular advantages in the context of the present invention. This is because the printed circuit board layer, on which the security element 40 is to be formed need not be fully immersed into an electroplating bath; so that the expense of a large bath and associated equipment are avoided. Further, by not immersing the printed circuit board into a liquid bath, the deleterious effects of the plating solution on the overall board are avoided. In addition, the use of brush plating eliminates the need for masking and for the washing away of expensive chemical solutions after electroplating has been carried out. Suitable brush plating equipment is readily commercially available from companies that supply conventional electroplating equipment.

After the security element 40 has been formed on the ground plane layer, the epoxy resin layers may be laminated together. This lamination step is generally carried out simply by applying heat and pressure to the layers after they have been assembled. The heat and pressure causes the epoxy resin layers to soften and fuse together. It has been found that this heat and pressure does not adversely affect the performance of the security element 40; and the presence of the thin security element does not affect the integrity of the resulting lamination.

After the lamination of the printed circuit board 10 is complete, various integrated circuit elements and assemblies may be mounted on the board and electrically connected to the various terminals formed on the board.

The security element 40 may be deposited as a continuous film on the ground plane layer 26. Alternatively, well known masking techniques may be used to form the security element in any desired shape (such as a strip, a ring, etc.). It is preferred that the security element 40 be in the form of a plurality of closely spaced strips which are 1 mm wide and 12.7 mm apart. The masking technique may be the same as that used when selectively etching the copper layers to form printed circuit elements.

The security element 40 may be deposited on the copper ground plane layer 40 either before or after that layer has been etched for the through holes 38. Provided that the number of through holes is not such that a substantial portion of the security element is interrupted, their presence will not significantly interfere with the performance of the security element 40. An example of through holes passing through the security element 40 is shown at 42 in FIG. 1.

Although the security element 40 has been described as being deposited on the ground plane layer 26, it may also be deposited on one or more of the conductors 22, 24 or 28 on one of the electrical pathways 30, 32 or 34.

It will be appreciated that after the printed circuit board 10 has been assembled, the security element 40 is hidden from view; and it is unlikely that anyone would try to remove it. Further, any attempts to remove the security element would result in destroying the printed circuit board and render inoperable any assembly into which it may have been incorporated.

The security element 40 does not interfere with the electrical operation of the printed circuit board 10 or with any assembly into which the printed circuit board may be incorporated. Conversely the printed circuit board 10 does not adversely affect the operation of the security marker 40.

Figure 2:
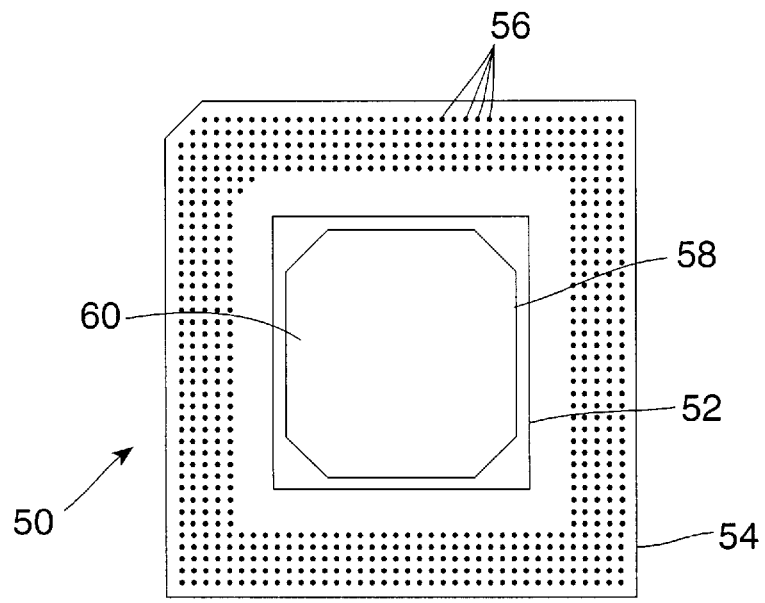
FIG. 2 is a plan view of an integrated circuit assembly comprising a further preferred embodiment of the present invention.

As shown in FIG. 2, an integrated circuit assembly in the form of a microprocessor 50 includes a circuit portion 52 mounted on a base 54 which contains a plurality of connecting pins 56 near its peripheral edges. The circuit portion 52 comprises several semiconductor components and connections, all of which are encapsulated in an outer housing. The microprocessor 50 may, for example, be an Intel® Pentium® microprocessor. These microprocessors serve as the central processing unit in many microcomputers; and they are very valuable even when they are not yet assembled in a computer.

Microprocessors contain a very large number of semiconductor elements; and they operate at very high frequencies. Because of this, most microprocessor chips are provided with a heat dissipation element, such as a heat sink 58 which is located on the circuit portion 52. The heat sink 58, which is shown in greater detail in FIG. 3, comprises a copper plate which is coated over all of its surfaces with a nickel plating. In this embodiment, the heat sink 58 forms a portion of an Intel® Pentium® microprocessor; and it is preferably made up of a nickel plated copper plate which is 1.0 millimeter (mm) thick and is generally rectangular (25.7 mm×22.9 mm). The corners of the heat sink 58 are chamfered at 45° and are about 5 mm long. The copper plate is effective to dissipate heat; and its nickel plating provides corrosion resistance.

Figure 3:
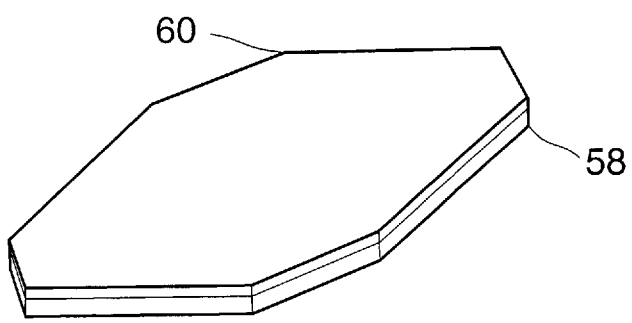
FIG. 3 is a perspective view of a metal plate on which a security element is formed and which is incorporated in the integrated circuit of FIG. 2.

As shown in FIGS. 2 and 3 a security member 60, which is in the form of a film, covers the surface of the heat sink 58. The security member 60 is a strip of easily magnetizable material which is characterized by high magnetic permeability, low magnetic coercivity and low magnetic saturation. This material will respond to alternating magnetic interrogation fields, such are generated by an electronic article surveillance system of the type described in U.S. Pat. No. 4,623,877 and No. 5,264,829, by producing distinctive disturbances in those interrogation fields. When an article on which the security member 60 is mounted is carried through an interrogation zone where these alternating magnetic interrogation fields are present, the security member 60 produces characteristic disturbances in these fields; and these disturbances are detected by the surveillance system. The surveillance system then produces a visual or an audible alarm to signal the passage of the article through the interrogation zone.

While the security member 60 covers the entire surface of the heat sink 58, it need not cover the entire surface; and, depending on the particular application or environment in which the security member will be used, it may be formed according to any appropriate shape, for example, an elongated strip or a ring. The particular shape chosen will usually depend on the configuration and intensity of the magnetic interrogation fields to which the strip is to be exposed.

The security member 60 may be formed on the heat sink 58 before the heat sink is attached to the microprocessor 50. The security member is adhered to the heat sink by being formed directly thereon. The security member 60 may be formed as a film from the liquid phase, as by electroplating, electroless plating, or by a thermal spray process. Alternatively, the security member may be formed as a film from the vapor phase, as by vacuum coating or by chemical vapor deposition. Each of these techniques is well known to those skilled in the art of metal coating. By controlling temperature, pressure, current, etc. of the strip forming process, the resulting strip will be in a crystalline or an amorphous form. What is important is that the security member 20 be formed directly on the heat sink 18 so that it adheres securely to the heat sink without the intervention of any adhesive. If it is desired to form the security member in any specific shape, for example, as an elongated strip, well known masking techniques may be employed. It is, of course, important that the security member 60 have good magnetic properties. That is, the security member should have a magnetic coercivity in the range of 0.1 and 1.0 oersteds, and preferably about 0.25 oersteds. It should have a magnetic permeability in the range of 100,000 and 1,000,000, and preferably about 750,000. Also, the security member 60 should have a magnetic saturation in the range of 0.5 and 2.0 Telsa and preferably about 0.6 Telsa. The composition of the security member is preferably about 80% cobalt and 20% phosphorous. Alloys of cobalt and nickel as well as Permalloy® may also be used.

A preferred method of depositing the material of the security member 60 onto the heat sink 58 is that of electrodeposition or electroplating. In this method an amorphous cobalt phosphorous alloy film is deposited directly onto the nickel-plated copper heat sink 58. The film has high magnetic permeability and low magnetic coercivity. The film is deposited by an electrodeposition process in a manner well known to those skilled in the art. The electrodeposition or plating takes place in a bath which consists of an aqueous acidic solution of cobalt carbonate and phosphorous acid.

Preferred operating parameters of this process are as follows:
Bath temperature: 84°–86° Centigrade
Bath acidity: 0.5–1.0 pH
Plating current: Sinusoidal alternating current with a frequency of 5 Hertz, varying between +0.6 and −0.2 amperes per square centimeter ($A/cm^2$).
Plating anode: Cobalt The deposition process is carried out until the deposited film attains a thickness in the range of 0.5 to 15 microns, and preferably about 1–2 microns.

Where the security element 60 is to have a special shape, for example, that of a thin elongated strip, known masking techniques may be employed to limit the deposition of the low magnetic coercivity material to a specific area on the heat sink 58.

Even though the nickel coating on the heat sink 58 is magnetic, it will not affect the operation of the security strip 60. This is because the nickel coating has a magnetic coercivity of approximately one hundred times that of the security member 60.

Because the security member 60 is directly formed on the heat sink 58 it firmly adheres to the heat sink; and this adherence is not affected by subsequent temperature variations that may be encountered during operation of the microprocessor 50 or by subsequent manufacturing operations such as soldering.

After the security member 60 is formed on the heat sink 58, the heat sink is then assembled onto the microprocessor 50 and held in place by means of adhesive or soldering.

While the addition of the strip 60 to a single heat sink is described above, it should be understood that the security strip 60 may be formed on a long strip of heat sink material which then may be severed into individual heat sinks for application to several microprocessors or other integrated circuit assemblies.

As in the case of the film formed security element 40 of FIG. 1, it has been found that the detectability of the film which constitutes the security member 60 in FIGS. 2 and 3 may also be significantly increased by subjecting it to a heat treating process in which the temperature of the strip is increased for a time.

Preferably, the film should be heated to and maintained at a temperature of at least 100 degrees Centigrade for a duration of at least one hour; or heated to and maintained at a temperature of at least 200 degrees Centigrade for a duration of at least five minutes. This heat treatment serves both to increase the magnetic permeability and to decrease the magnetic coercivity of the strip material.

Similarly, the detectability of the film is further improved by carrying out the heating step in the presence of an externally applied magnetic field which is directed along the film, that is in the direction in which the film extends. Here also, the strength of the magnetic field is preferably about 120 oersteds; and it should be in the range of 70–170 oersteds.

As shown in FIG. 4, an integrated circuit assembly 70, according to the present invention, comprises an integrated circuit chip 72, which may, for example, be the central processing unit for a computer, and a security element 74. In this embodiment, the integrated circuit chip comprises a rigid, wafer-like, rectangular base member 76 which may be of plastic or silicon and which supports integrated circuits contained in a housing 78 mounted on the upper surface of the base member. Connecting pins 80 extend down from the bottom surface of the base member 76 for solder connection to terminal points of printed circuit boards or for connection to other connecting elements of electrical components with which the assembly 70 is to be assembled.

The security element 74 is in the form of a thin elongated strip of a special material which is capable of responding to alternating magnetic field of less that 1 oersted and of disturbing such field in a characteristic manner. An amorphous magnetizable metal, such as Metglas® 2714AZ supplied by Allied Signal Company of Morristown, N.J., is preferred. The security element 74 has a length of about 5 centimeters, a width of 1 millimeter and a thickness of 15–25 microns. As shown in FIG. 4, the security element 74 extends along an outer edge surface 16a of the wafer-like base member 16 which defines the thickness of the base member.

Turning now to FIG. 5, it will be seen that the security element 74 is held to the base member 76 by means of an adhesive 82, such as an epoxy. It is important that the adhesive be capable of withstanding the environmental conditions to which the assembly 70 will be subjected during further processing. For example, where the pins 80 of the assembly are to be soldered to other elements, the adhesive must be capable of holding the security element securely to the base element 76 even when exposed to the high soldering temperatures. Also, the adhesive must be capable of resisting unauthorized attempts to remove the security element 74 by cutting or scraping. As can be seen, the adhesive 82 extends continuously along the length of the security element 74.

The security element 74 is provided with deactivation means in the form of a group of slug-like deactivation elements 84. These elements have the same width as the security element 74, namely about 1 millimeter. Also they may have a length of from about 3 millimeters to about 10 millimeters; and their spacing may vary from about 3 to about 10 millimeters. The thickness of the deactivation elements 84 may be about three times the thickness of the security strip 74, namely 45–60 microns. These deactivation elements are made of a high coercive force magnetizable material, such as that sold under the name ARNOKROME-III® by Arnold Engineering Company of Marengo, Ill. The elements 84 can be magnetized by subjecting them to a unidirectional magnetic field of about 100–150 oersteds. When this field is removed, the elements 84 retain their acquired magnetism and thereafter magnetically bias the security element 74 in a manner such that it no longer responds to applied alternating interrogation fields. The security element 74 can be reactivated at a later time by subjecting the deactivation elements 84 to an alternating magnetic field of decreasing intensity which demagnetizes the deactivation elements. It is also preferred that the security elements 84 be formed on the security element 74 by an atom by atom deposition process, namely, by electroplating, by sputtering or by vacuum deposition, such as described in U.S. Pat. No. 5,401,584.

It is preferred that the security element 14 have zero or near zero magnetostriction. As can be seen from FIG. 5, the adhesive 82, which must hold the strip 74 very securely to the base element 76, extends continuously along the entire length of the security element. Consequently any difference in expansion between the base and the strip will be resisted by the adhesive. Differences in expansion can occur in two ways. First, when the assembly 70 is subjected to heat from a subsequent soldering operation, the security element will tend to elongate at a much greater rate than the base member 76. Secondly, when the security element 74 is subjected to magnetic interrogation fields, a magnetostrictive effect takes place. By providing a security element with zero or near zero magnetostriction, mechanical stresses produced in the security element will have little or no effect on its magnetic response characteristics. The above referred to material, namely Metglas® 2714 AZ has a saturation magnetostriction less than $10^{-6}$, which has been found to be satisfactory.

Turning now to FIG. 6, there is shown a modified arrangement wherein a security element 74a is arranged to extend along two edges 90a and 90b of an integrated circuit assembly 70. This permits a higher degree of sensitivity because the security element 74a extends in two different directions and it may be longer than the security element 74 shown in FIG. 4.

FIGS. 7 and 8 show a further embodiment of the present invention wherein there is provided a groove 92 which extends along the rigid non-metal base member 76. The security element 74, with its deactivation elements 84, is placed in the groove 92 and is covered with an epoxy or similar filler material 94, as shown in FIG. 8. This serves to conceal the security element and to protect it against tampering. Magnetic fields readily pass through the material of the base member 76 and through the epoxy filler material 94 in the groove 92; and therefore the security element 74 can be activated and deactivated by application of such fields as described above. It will be appreciated that the filler material 94 serves also as an adhesive which extends continuously along the length of the security element 74 and holds it securely to the base member 76.

FIGS. 9 and 10 show a still further embodiment wherein the security element 74 with its deactivation elements 84 is embedded in the rigid wafer-like base member 76 during the formation thereof. For example, where the wafer-like base member 76 is formed by molding, the security element 74 can be mounted in the mold and the material of the base member can be injected into the mold to surround the security element. This facilitates the overall manufacture of the assembly 70 because it permits installation of the security element 74 in the base member before the integrated circuit is mounted thereon. Also no additional material, such as an epoxy filler, is needed; and the security element 74 is even more securely enclosed and is better concealed than in the other embodiments. Here too, the material of the base member 76 serves as an adhesive which extends continuously along the length of the security element 74 to hold it securely in place.

The embodiments shown and described in connection with FIGS. 7–10 have the additional advantage that electrically conductive connector elements (not shown) may extend from the integrated circuit contained in the housing 78 and along the surface of the base member 76 without any electrical or magnetic interference between those conductors and the security element 74.

Figure 11:
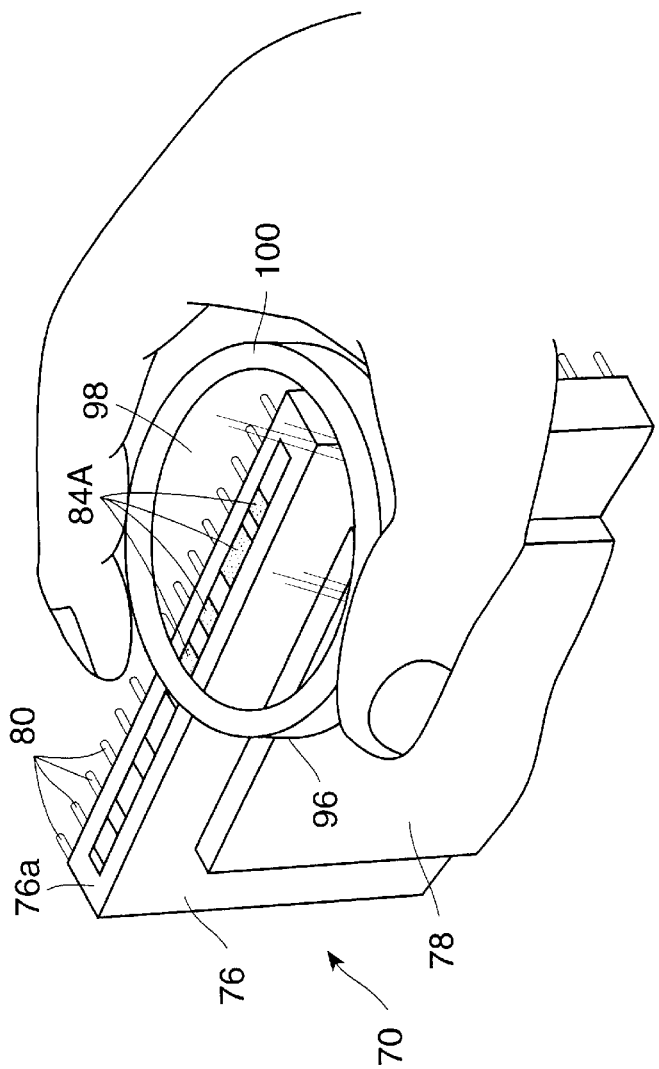
FIG. 11 is an enlarged fragmentary perspective view, similar to FIG. 1, and showing another feature of this invention.

FIG. 11 illustrates a further feature of the invention. As shown in FIG. 11, deactivation elements 84a of various length are arranged with various spacing from one another along the security element 84. This varied arrangement does not affect the ability of the deactivation elements 84a to control the activation and deactivation of the security element 74. However, because the arrangement is unique and is concealed, it can be used as a counterfeit protection feature. When the elements 84a are in their magnetized state, the fields that they produce appear in a pattern which corresponds to their length and spacing. The pattern of these fields can be detected by use of a magnetic field detector 96 held along the assembly 70.

By arranging the length and spacing of the deactivation elements, it is possible to provide a code, which may for example include the name of the manufacturer, the serial number of the integrated circuit assembly, the date of its manufacture, etc., which is integrated into the assembly in a manner that it is not readily recognizable. This code, however, can be read with the use of the magnetic field detector 96. This will assist integrated circuit assembly manufacturers to ascertain whether similar looking assemblies are counterfeit.

The magnetic field detector 96 may comprise a pair of parallel plates 98 of non-magnetic material. At least one of these plates is transparent. The plates 98 are held in closely spaced arrangement by an outer ring 100. A viscous liquid, such as mineral oil, fills the space between the plates 98. Iron filings are mixed in with the liquid between the plates. These filings, which are dark in color, become aligned with ambient magnetic fields, such as those being generated by the deactivation elements 84. Therefore, when the detector 36 is positioned adjacent a security element 74 as shown in FIG. 11, the iron filings in the detector 96 become arranged according to the pattern of the deactivation elements 84, thereby making them, in effect, visible.

Figure 12:
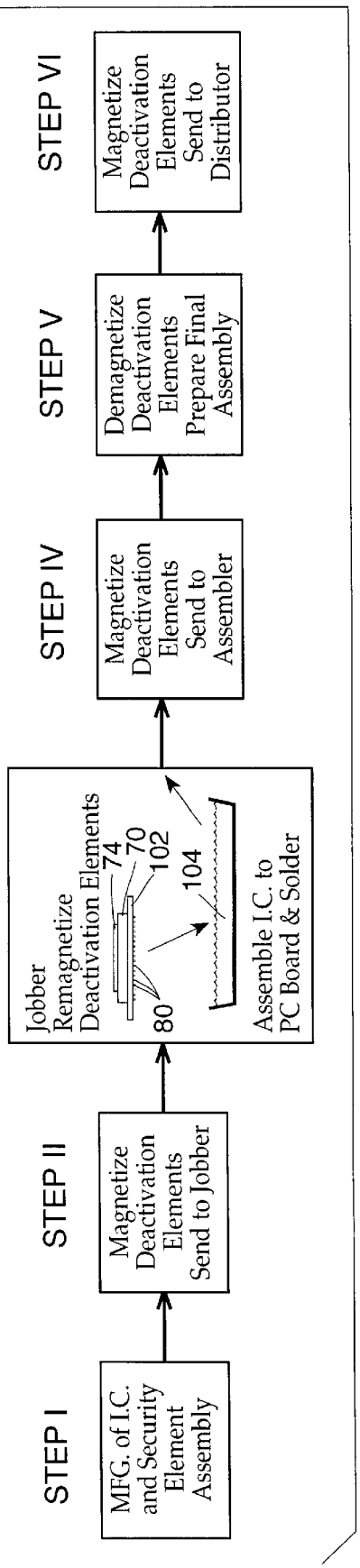
FIG. 12 is a diagrammatic view showing the further processing of the integrated circuit assembly of the present invention.

The process diagram of FIG. 12 illustrates the manner in which the present invention provides protection for the integrated circuit assembly 70 throughout successive assembly and distribution operations. This protection, moreover, encompasses the various overall assemblies into which the integrated circuit assembly 70 becomes incorporated.

In Step I of FIG. 12, an integrated circuit assembly 70, comprising an integrated circuit 12 and a security element 74, is first manufactured as described above. The assembly 70 may have utility in any of several applications, depending on the configuration of the assembly and the particular device into which it later becomes incorporated.

The assembly 70 has a high value; and it is important to protect it from theft or other unauthorized removal. This problem has been especially difficult in the past because the assembly 70 must be disposed where it is readily available for shipment or for subsequent stages of manufacture; and therefore it is readily accessible to anyone in the area who may want to take it. Also, the assembly 70 is quite small and it becomes easy for anyone to who wishes to steal it, simply to put it into his or her pocket and leave the premises without the unauthorized taking being noticed. With the present invention, when the assemblies 70 are provided with the security elements 74, their deactivation elements 84 are demagnetized; and the security elements 74 are in their active condition. Accordingly, if an assembly 70 is taken through an exit which has been provided with an electronic article surveillance system, the active security element will disturb the magnetic interrogation fields being generated at the exit and actuate an alarm.

The assembly 70, as shown in Step II of FIG. 12, is next sent to a jobber, which may be the manufacturer of the assembly 70 or which may be an independent company. In order to permit the assembly 70 to be shipped to the jobber without causing an alarm to be actuated, the deactivation elements 84 are magnetized, as above described. This prevents the security elements 74 from disturbing magnetic interrogation fields being generated at the exit from the manufacturing or storage location so that the assemblies 70 can be taken to the jobber's location without actuation of an alarm. Then, when the assemblies 70 arrive at the jobber, their deactivation elements 84 may be demagnetized to reactivate the security elements 74 and protect the assemblies 70 from unauthorized removal from the jobber's plant.

As shown in Step III in FIG. 12, the integrated circuit assembly 70 is soldered to a printed circuit board 102. This is done by placing the assembly 70 on the board 102 so that the pins 80 of the assembly 70 pass through corresponding holes in the printed circuit board. This overall assembly is then lowered down to the surface of a bath 104 of molten solder so that the pins 80 dip into the solder. The overall assembly is then raised; and the solder that sticks to the pins 80 cools and hardens. This provides positive electrical connection between the pins 80 and conductive circuit paths which extend along the board 102. It will be appreciated that the overall assembly is now protected from unauthorized removal by the security elements 74 on the integrated circuit assembly 70. Thus, any attempt to remove the overall assembly from the premises will result in a disturbance of electromagnetic interrogation fields which are generated at the exit from the jobber's plant by the jobber's own electronic article surveillance system.

Thereafter, as show in Step IV in FIG. 12, the overall assembly, comprising the integrated circuit assembly 70 and the printed circuit board 102, is shipped to a final assembly operation, which may by a computer assembly plant. Here also, the deactivation elements 8 may be remagnetized to deactivate the security elements 74 so that the assemblies can be taken from the jobber's plant without actuating an alarm.

In Step V shown in FIG. 12, the overall assembly is integrated into a final assembly, such as a computer.

When this is done, the deactivation elements 84 can be demagnetized so that the computer or final assembled product will be protected from theft. It should be understood that the final product should not have such a metal content as will effectively inhibit the operation or detection of the security marker. Then, as shown in Step VI in FIG. 12, when it is time to ship the final assembly to a dealer or distributor, the magnetic deactivation elements 84 can be magnetized again to allow the final assembly to be shipped. After the assemblies have arrived at the dealer or distributor, the deactivation elements 84 can be demagnetized so that the security elements 74 will again become active and thereby protect the final assembly from theft.

It will be appreciated that the deactivation elements can be demagnetized and remagnetized with magnetic fields that are remotely generated, either by permanent magnets or by electromagnets. Therefore, it is possible to provide security for components, subassemblies and overall assemblies with the same security elements. Further, the security elements need be applied at only one stage in the overall manufacturing and distribution operation. Because of this, security from unauthorized removal is made convenient; and the time and expense of providing security is minimized. Further, the above described procedure ensures that the most valuable parts of the final assembly, namely the integrated circuits, are protected from the outset.

FIG. 13 shows a security marker 110 of the type which can be used in the present invention. This security marker is an elongated strip of material which is characterized by a low magnetic coercivity and a nearly rectangular magnetic hysteresis characteristic. Such material may be, for example, Permalloy®, or it may be an amorphous cobalt alloy. An example of an amorphous metal marker is described in U.S. Pat. No. 5,029,291. A typical marker will have a rectangular cross section of 1 mm (millimeter)×0.015 mm; and a length of about 2.5 cm (centimeters) to 10 cm.

The marker 110 is provided with a coating 112 of an epoxy resin so that its overall cross section is increased to about 0.040 inches by 0.006 inches. The coating of wire or other elongated materials with epoxy resin is well known and is described, for example, in U.S. Pat. No. 4,297,386 and No. 4,332,835. In this case, the marker 110 is positioned in a fluidizing chamber which contains powderized resin particles. These particles are aerated and are electrostatically charged by ionized air which passes through a porous plate at the base of the chamber. As the powdered particles become charged they repel each other and rise above the chamber, forming a cloud of charged particles. The marker 110 is connected to electrical ground; and because of the opposite potential of the charged particles, they are attracted to the marker 110 on which they form a coating of uniform thickness. This thickness is controlled by the applied voltage and by the exposure time on the marker to the cloud of resin particles. Preferably, the coating 112 is of a thickness that causes the coated marker 110 to have a cross section of 1.016 mm by 0.152 mm.

The resin powder is preferably that sold under the trademark Scotchcast® Brand Wire Coating Resin 5256 by the Minnesota Mining and Manufacturing Company Electrical Specialties Division in Austin, Tex. This resin, when cured, provides good electrical properties in that it is highly insulative. The resin also provides good mechanical properties in that it can endure temperatures up to 145 degrees Centigrade for as much as 20,000 hours and it can withstand a significant amount of bending stresses.

After the marker 110 is coated with the resin coating 112, the resin is cured by subjecting it to a temperature from 200 to 400 degrees Centigrade for a period from 0.2 to 15 minutes. Higher curing temperatures require lesser amounts of time to cure the resin. As shown in FIG. 14, once the resin coating 112 is cured, it forms a casing 113 around the marker 110. The material of this casing need not adhere to the material of the marker. Instead, the marker 110 is enclosed within the casing 113 and is thereby mechanically held in place.

Turning now to FIG. 15, there is shown an edge portion of a printed circuit board 114 to which the marker 110 is to be attached. The printed circuit board 114 is made up of a thin sheet 116 of electrically non-conductive material, such as epoxy resin. The sheet 116 may be made up of a laminate of several layers. Electrically conductive elements 118 of copper or the like are formed on the surface of the sheet 116, preferably by electroplating. The particular construction of the board 114 is not critical to this invention; and techniques for making such boards are well known to those skilled in the art.

The board 114 has a thin edge 120 which provides a desirable location for a security marker. However, the edge 120 is so thin that it has not been possible in the past to provide a secure bond with a thin security marker such as the marker 110, which is made of metal and does not make a good bond with adhesive materials.

As shown in FIG. 16, a fast cure adhesive 122 is applied from an adhesive applicator 124 to the edge 120 of the board 114. A suitable adhesive for this purpose is sold under the trademark Permabond Plus® 792 Adhesive; and is available from Permabond International of Englewood, N.J. This material is a fast curing (cure speed 1–7 seconds), surface insensitive, cyanoacrylate adhesive of medium viscosity. The applicator is preferably part of an adhesive dispensing system which is sold by Permabond International under the trademark Accu-quip.

After the adhesive 122 has been applied to the edge 120 of the board 114, the casing 113, which contains the marker 110, is placed onto the edge 120 of the printed circuit board, as shown in FIG. 17. Then, as shown in FIG. 18, an adhesive activator 126 is applied from an adhesive activator spray nozzle 128 to the adhesive 122 on the edge 120 of the board 114. This adhesive activator serves to reduce the cure time of the cyanoacrylate adhesive 122; and it is recommended when such adhesive is used for bonding to porous materials and for bonding inactive surfaces. A preferred example of such adhesive applicator is that known as Permabond QFS 16 solvent type haptene general purpose activator for cyanoacrulates. This activator material is also available from Permabond International.

After the adhesive 122 has become cured, the marker 110, which is encased in the casing 113, is bonded to the edge of the printed circuit board as shown in FIG. 19. It will be appreciated that the marker 110 need not adhere either to the coating 112 or to the adhesive 122. Instead, the marker 110 is held in place because it is encased within the casing formed around it by the coating 112; and the casing in turn is held to the edge of the printed circuit board 114 by the adhesive 122.

The marker 110 is thus securely affixed to the printed circuit board. It will be appreciated that the board 14 may be flexible; and bending or other distortions which cause stress in the adhesive 122, do not affect the integrity of the bond which holds the marker 110 in place.

We claim:

1. A printed circuit board assembly comprising:

at least one sheet of electrically non-conductive material;

an electrically conductive layer formed on a surface of said sheet, said layer being shaped to provide a portion of an electrical circuit;

a security element comprising a film of low magnetic coercivity material which is easily magnetically saturated, said security element being formed on said electrically conductive layer.

2. A printed circuit board assembly according to claim 1, wherein said electrically conductive layer is an expansive, continuous layer which forms an electrical ground plane on one side of said one sheet, wherein electrically conductive signal pathways are formed on the other side of said sheet and wherein at least one of said signal pathways is electrically connected to said electrically conductive layer through said one sheet.

3. A printed circuit board assembly according to claim 1, wherein said board assembly includes at least two sheets of electrically non-conductive material and wherein said electrically conductive layer and said security element are laminated between adjacent sheets.

4. A printed circuit board assembly according to claim 1, wherein said electrically conductive layer forms a ground plane and wherein a printed electrical circuit is formed on an outer surface of one of said sheets and is connected via a conductor element extending through said one sheet to said ground plane.

5. A method of manufacturing a printed circuit board assembly having theft resistant capability, said method comprising the steps of:

forming an electrically conductive layer on a surface of a sheet of electrically non-conductive material, said electrically conductive layer being shaped and arranged to form a portion of an electrical circuit, and depositing on said electrically conductive layer a film of low magnetic coercivity material which is easily magnetically saturated.

6. A method according to claim 5, wherein a plurality of other sheets are thereafter laminated together to enclose said electrically conductive layer and said film.

7. A method according to claim 5, wherein said film is formed by electrodeposition by brush plating.

8. A method according to claim 5, wherein said film is heated to a temperature of at least 100 degrees Centigrade for a duration of at least one hour.

9. A method according to claim 8, wherein said film is subjected to a steady magnetic field in the range of 70–170 oersteds, and oriented to extend along said film, while said film is being heated.

10. A method according to claim 8, wherein said film is subjected to a steady magnetic field of about 120 oersteds and oriented to extend along said film, while said film is being heated.

11. A method according to claim 5, wherein said film is heated to a temperature in the range of 200 degrees Centigrade for a duration of at least five minutes.

12. A method according to claim 11, wherein said film is subjected to a steady magnetic field in the range of 70–170 oersteds, and oriented to extend along said film, while said film is being heated.

13. A method according to claim 11, wherein said film is subjected to a steady magnetic field of about 120 oersteds, and oriented to extend along said film, while said film is being heated.

14. A theft resistant integrated circuit assembly comprising at least one integrated electrical circuit which incorporates a metallic heat dissipation element, and a security member in the form of a film of magnetizable material which becomes driven into and out of magnetic saturation in response to an alternating magnetic interrogation field, said security element being formed directly on the surface of said heat dissipation element.

15. A theft resistant integrated circuit assembly according to claim 14, wherein said security member is an amorphous alloy.

16. A theft resistant integrated circuit assembly according to claim 14, wherein said security member is a crystalline alloy.

17. A method of making a theft resistant integrated circuit assembly said method comprising the steps of providing a metallic heat dissipation element, directly forming on the surface of said heat dissipation element a film of magnetizable material which becomes driven into and out of magnetic saturation in response to an alternating magnetic interrogation field, and mounting said heat dissipation element on an integrated electrical circuit.

18. A method according to claim 17, wherein said film of magnetizable material is formed by electroplating the material directly onto the surface of said heat dissipation element.

19. A method according to claim 17, wherein said film of magnetizable material is formed by chemical vapor deposition of the material directly onto the surface of said heat dissipation element.

20. A method according to claim 17, wherein
said film of magnetizable material is formed by electroless plating of the material directly onto the surface of said heat dissipation element.

21. A method according to claim 17, wherein
said film of magnetizable material is formed by thermal spray coating of the material directly onto the surface of said heat dissipation element.

22. A method according to claim 17, wherein
said film of magnetizable material is formed by vacuum coating of the material directly onto the surface of said heat dissipation element.

23. A method according to claim 17, wherein
said film is heated to a temperature of at least 100 degrees Centigrade for a duration of at least one hour.

24. A method according to claim 23, wherein
said film is subjected to a steady magnetic field in the range of 70–170 oersteds, and oriented to extend along said film while said film is being heated.

25. A method according to claim 17, wherein
said film is heated to a temperature in the range of 200 degrees Centigrade for a duration of at least five minutes.

26. A method according to claim 25, wherein
said film is subjected to a steady magnetic field of about 120 oersteds, and oriented to extend along said film while said film is being heated.

27. A method according to claim 25, wherein
said film is subjected to a steady magnetic field in the range of 70 to 170 oersteds, and oriented to extend along said film, while said film is being heated.

28. A method according to claim 25, wherein
said film is subjected to a steady magnetic field of about 120 oersteds, and oriented to extend along said film while said film is being heated.

29. A theft resistant integrated circuit assembly comprising
at least one integrated electrical circuit supported by a rigid non-metallic support element and,
a security element in the form of an elongated strip of magnetizable material of nearly zero magnetostriction which becomes driven into and out of magnetic saturation in response to an alternating magnetic field, said security element being mounted to extend along said support element adjacent said integrated electrical circuit.

30. A theft resistant integrated circuit assembly according to claim 29, wherein
said rigid non-metallic element is in the form of a thin wafer-like member and
wherein said security element is mounted to extend along an edge surface which defines the thickness of said wafer-like member.

31. A theft resistant integrated circuit assembly according to claim 30, wherein
said security element is adhered to said wafer-like member by means of an adhesive which extends continuously along the length of said security element.

32. A theft resistant integrated circuit assembly according to claim 31, wherein
said security element is an amorphous alloy.

33. A theft resistant integrated circuit assembly according to claim 29, wherein
said security element has associated therewith a plurality of magnetizable deactivation elements which, when magnetized, effectively deactivate said security element.

34. A theft resistant integrated circuit assembly according to claim 33, wherein
said security element with its deactivation elements is embedded in the material of said rigid non-metallic element.

35. A theft resistant integrated circuit assembly according to claim 33, wherein
at least one of the length and spacing of said deactivation elements is irregular along the length of said security element.

36. A theft resistant integrated circuit assembly according to claim 35, wherein
at least one of said length and spacing correspond to an identification code.

37. A theft resistant integrated circuit assembly according to claim 36, wherein
said security element is concealed in said rigid non-metallic element.

38. A theft resistant integrated circuit assembly according to claim 33, wherein
said security element is positioned in a groove which extends along said rigid non-metallic element.

39. A theft resistant integrated circuit assembly according to claim 38, wherein
said security element is held in said groove by means of an adhesive which extends continuously along its length.

40. A theft resistant integrated circuit assembly according to claim 39, wherein
said adhesive is an epoxy material which fills said groove and covers said security element and its deactivation elements.

41. A method of protecting an electronic assembly during successive stages of manufacture and distribution, said method comprising the steps of
providing an integrated circuit assembly comprising at least one integrated electrical circuit supported by a rigid non-metallic support element and further comprising a security element in the form of an elongated strip of magnetizable material of nearly zero magnetostriction which becomes driven into and out of magnetic saturation in response to an alternating magnetic field,
said security element being mounted to extend along said support element adjacent said integrated electrical circuit and
thereafter incorporating said integrated circuit assembly into a larger assembly.

42. A method according to claim 41, wherein
said security element has associated therewith a plurality of magnetizable deactivation elements which, when magnetized, effectively deactivate said security element and wherein
the magnetized state of said deactivation elements is changed prior to incorporating said integrated circuit assembly into a larger assembly.

43. A method of attaching a security marker to the surface of an object, said method comprising the steps of:
coating said security marker with a fluid material which is capable of becoming solid;
solidifying said material to form an enclosure which encases said security marker and holds the marker in place mechanically without adhering to it; and
thereafter adhering said enclosure to the surface of an object.

44. A method according to claim 43, wherein
said security marker is a metal element and wherein
said fluid material is an epoxy resin.

45. A method according to claim 43, wherein
said fluid material is caused to become electrostatically attracted to said security marker.

46. A method according to claim 43, wherein
said step of solidifying said material comprises subjecting said material to sufficiently high temperature for sufficient time to cure said material.

47. A method according to claim 43, wherein said step of adhering is done by application of a curable adhesive material to said object,
placing the encased security marker in said adhesive material and
thereafter curing said adhesive material.

48. A method according to claim 43, wherein
said object is a printed circuit board and wherein
said encased security marker is adhered to said printed circuit board to extend along an edge surface thereof.

\* \* \* \* \*

UNITED STATES PATENT AND TRADEMARK OFFICE
CERTIFICATE OF CORRECTION

PATENT NO. : 5,847,650

DATED : December 8, 1998

INVENTOR(S): Peter Y. Zhou et al.

It is certified that error appears in the above-identified patent and that said Letters Patent is hereby corrected as shown below:

COLUMN 1

Line 32, "used-to" should read --used to--.

COLUMN 2

Line 32, "an" should read --as--.
   Line 38, "new-born" should read --newborn--.

COLUMN 6

Line 18, "cross sectional" should read --cross-sectional--.
   Line 28, "FIG. 3;" should read --FIG. 13;--.

COLUMN 9

Line 46, "Conversely" should read "Conversely,"

COLUMN 11

Line 16, "element" should read --member--.
   Line 22, "strip" should read --member--.
   Line 35, "strip" should read --security member--.
   Line 37, "strip" should read --member--.

UNITED STATES PATENT AND TRADEMARK OFFICE
CERTIFICATE OF CORRECTION

PATENT NO. : 5,847,650

DATED : December 8, 1998

INVENTOR(S) : Peter Y. Zhou et al.

Page 2 of 3

It is certified that error appears in the above-identified patent and that said Letters Patent is hereby corrected as shown below:

COLUMN 12

Line 8, "to" should read --to an--.
    Line 9, "less that" should read --less than--.

COLUMN 13

Line 7, "AZ" should read --AZ,--.

COLUMN 14

Line 43," to who" should read --who--.

COLUMN 15

Line 19, "show" should read --shown--.
    Line 22, "may by" should read --may be--.

COLUMN 17

Line 30, "circuit;" should read --circuit; and--.

UNITED STATES PATENT AND TRADEMARK OFFICE
CERTIFICATE OF CORRECTION

PATENT NO. : 5,847,650

DATED : December 8, 1998

INVENTOR(S) : Peter Y. Zhou et al.

It is certified that error appears in the above-identified patent and that said Letters Patent is hereby corrected as shown below:

<u>COLUMN 18</u>

```
Line 51, "assembly" should read --assembly,--.
```

Signed and Sealed this

Twenty-seventh Day of April, 1999

*Attest:*

Q. TODD DICKINSON

*Attesting Officer*     Acting Commissioner of Patents and Trademarks